United States Patent [19]

Remsburg et al.

[11] Patent Number: 5,804,875
[45] Date of Patent: Sep. 8, 1998

[54] COMPUTER SYSTEM WITH HEAT SINK HAVING AN INTEGRATED GROUNDING TAB

[75] Inventors: Ralph Remsburg; Erica Scholder, both of Austin, Tex.

[73] Assignee: Dell Computer Corporation, Round Rock, Tex.

[21] Appl. No.: 763,238

[22] Filed: Dec. 10, 1996

[51] Int. Cl.$^6$ .............................. H05K 7/20; H01L 23/34
[52] U.S. Cl. .................. 257/718; 257/726; 257/727; 257/712; 257/719; 174/16.3; 361/704; 361/722
[58] Field of Search .................................. 257/712, 713, 257/718, 722, 717, 719, 727, 726, 625; 174/16.3; 361/704, 720, 705, 719, 700, 702, 707

[56] References Cited

U.S. PATENT DOCUMENTS

| Re. 35,573 | 7/1997 | Clemens et al. | 257/717 |
|---|---|---|---|
| 4,878,108 | 10/1989 | Phelps, Jr. et al. | 257/722 |
| 5,280,409 | 1/1994 | Selna et al. | 361/720 |
| 5,282,111 | 1/1994 | Hopfer | 361/704 |
| 5,331,507 | 7/1994 | Kyung et al. | 361/720 |
| 5,357,404 | 10/1994 | Bright et al. | 257/727 |
| 5,519,574 | 5/1996 | Kodama et al. | 361/697 |
| 5,561,325 | 10/1996 | Ueno et al. | 257/718 |
| 5,594,624 | 1/1997 | Clemens et al. | 257/727 |
| 5,598,320 | 1/1997 | Toedtman et al. | 361/687 |
| 5,600,540 | 2/1997 | Blomquist | 257/727 |
| 5,638,258 | 6/1997 | Lin | 257/727 |
| 5,668,348 | 9/1997 | Lin | 257/727 |

*Primary Examiner*—Tom Thomas
*Assistant Examiner*—Alexander Oscar Williams
*Attorney, Agent, or Firm*—Haynes & Boone, L.L.P.

[57] ABSTRACT

A method and apparatus for simultaneously coupling a heat sink to an electrical device and reducing electromagnetic interference caused by the heat sink being coupled to the electrical device. A mother board, as used in an electronic circuit, is situated so that an electrical pad is located proximate to a socket for receiving the electrical device. The electrical device is placed inside the socket, and further has the heat sink thermally coupled to a top surface thereof. The heat sink serves to dissipate any heat radiating from the electrical device into a surrounding air mass. A heat sink clip physically and electrically engages with the heat sink and physically engages with the socket, thereby securing the heat sink to the device and the device to the socket. The heat sink clip also includes a tab that, when the clip is engaged with the heat sink, is in electrical contact with the pad, which in turn is in contact with a ground power supply. As a result, any electromagnetic interference ("EMI") radiation emitting from the electrical device is dissipated through the clip and into the pad, and from there to the ground power supply.

18 Claims, 3 Drawing Sheets

COMPUTER SYSTEM WITH HEAT SINK HAVING AN INTEGRATED GROUNDING TAB

TECHNICAL FIELD

The invention relates generally to computer systems with heat transfer devices and interference-reducing devices used therein and, more particularly, to a method and apparatus for simultaneously coupling a heat sink to an electrical device and reducing electromagnetic interference caused by the heat sink being coupled to the electrical device.

BACKGROUND

Electrical devices are advancing in many ways. For example, many electrical devices, such as those used in computers, are seeing an increase in operating speed, overall size, and number of transistors. These advancements, while creating smaller and faster electrical devices, result in increased power consumption and heat generation inside the device. Many such electrical devices consume more than 30 watts of power and therefore create a very large amount of heat. Furthermore, many electrical devices such as semiconductor integrated circuits are housed in ceramic or plastic packages, which prevent the heat from dissipating directly to surrounding air.

The detrimental effects of excessive heat inside the electrical device, such as reduction of the extended life and reliability of the device, are well known in the art. As a result, designers of computers and other electronic circuits have utilized various techniques to remove, or dissipate, heat from the electrical device. One popular technique utilizes a heat sink to convect the heat from the electrical device and package, collectively referred to as a "chip." The heat sink is thermally coupled to the chip, thereby allowing heat to flow from the chip to the heat sink. As air moves across the surface of the heat sink, the heat is then transferred to the air, where it is carried away from the heat sink and the coupled chip.

The heat sink can be coupled to the chip in many different ways, such as using a clip. Typically, the heat sink is attached to a chip, which in turn is attached to a socket. The clip acts as a spring between the heat sink and the socket so that as it compresses, the chip is sandwiched between the heat sink and the socket. The clip is beneficial because it is easy to mount or replace, inexpensive, and very reliable.

The increase in operating speed, overall size, and number of transistors used in chips not only causes an increase in the heat production of the chip, but also causes the chip to radiate electromagnetic interference ("EMI"). This problem is exacerbated by the capacitive coupling between the heat sink and the chip. Through such coupling, the heat sink acts as an antenna for the EMI radiation, thereby amplifying the effects of the radiation.

To resolve the problem with EMI radiation emanating from the heat sink, there have been two prevalent solutions. The first solution is to place a thermal pad between the heat sink and the chip, the thermal pad having an embedded metallic plane. The metallic plane is electrically connected to a grounding strap, which is attached to a ground power supply such as a computer chassis or a power supply terminal. The second solution is to simply attach the grounding strap between the heat sink and the ground power supply. Although the second solution does not require a metallic plane, it does require that the portion of the heat sink where the grounding strap connects to be electrically conductive.

Problems with the above two solutions are primarily centered around size, manufacturability and cost. A grounding strap running from the heat sink to the chassis is cumbersome in the assembly or disassembly of the computer or electronic device. The long grounding strap also has the potential of being disconnected due to movement or vibrations. Such a long strap can also be expensive and further involves an extra step in manufacturing to attach the strap to both the heat sink and the ground power supply.

Therefore, what is needed is an arrangement for dissipating the heat generated by a chip that has a reduced level of EMI radiation.

Furthermore, what is needed is the heat dissipating arrangement of the above type that is relatively small, inexpensive and supports the manufacturability of the computer or electronic device in which it is being used.

SUMMARY

Accordingly, a heat sink clip is provided having an integrated grounding tab for use in computer systems and other electronic circuits. A mother board, as used in such electronic circuits, is situated so that an electrical pad is located proximate to a socket for receiving an electrical device. The electrical device is placed inside the socket, and further has a heat sink thermally coupled to a top surface thereof. The heat sink serves to dissipate any heat radiating from the electrical device into a surrounding air mass.

In one embodiment, a heat sink clip physically and electrically engages with the heat sink and physically engages with the socket for securing the heat sink to the electrical device and securing the electrical device to the socket. The heat sink clip includes a tab that, when the clip is engaged with the heat sink, is in electrical contact with the pad, which in turn is in electrical contact with a ground power supply. As a result, most of the electromagnetic interference ("EMI") radiation appearing in the heat sink is dissipated through the clip and into the pad, and from there to the ground power supply.

In another embodiment, a metallic plate is located in between the electrical device and the heat sink. The metallic plate includes a lip portion that engages with and is in electrical contact with the clip. As a result, most of the EMI radiation emitting from the electrical device is dissipated into the metallic plate and is transferred through the clip, through the pad, and thereby into the ground power supply.

DETAILED DESCRIPTION OF THE PREFERRED EMBODIMENT

Figure 1:
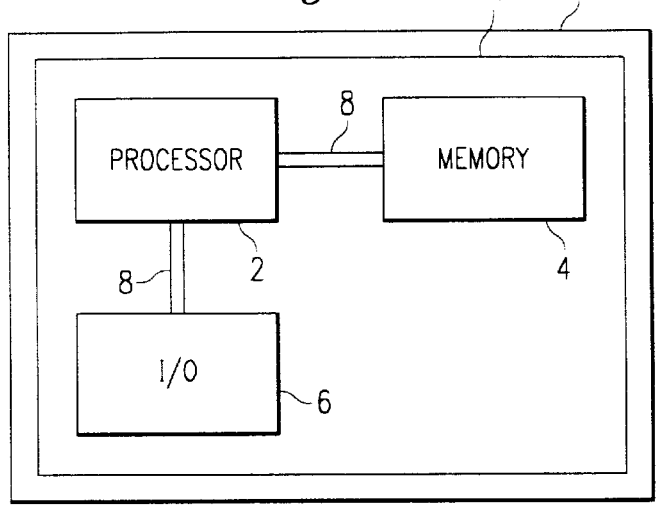
FIG. 1 is a diagram of a computer for implementing one embodiment of a heat sink clip.

Referring to FIG. 1, a preferred embodiment may be utilized in a personal computer 1 such as a desktop computer or a tower computer. The personal computer 1 includes a processor 2, memory 4, input/output (I/O) devices 6, and a bus 8 as well as other electrical traces interconnecting components of the computer. While not shown in detail, a mother board 10 is provided for mounting and interconnecting various electrical circuits, devices, and semiconductor integrated circuits such as the processor 2 and related components or other chip sets. Each of the integrated circuits are assembled in a package, and are hereinafter collectively referred to as a "chip." It is understood, however, that the term "chip" encompasses many different chips or heat producing devices, including discrete circuits and power supplies.

Figure 2:
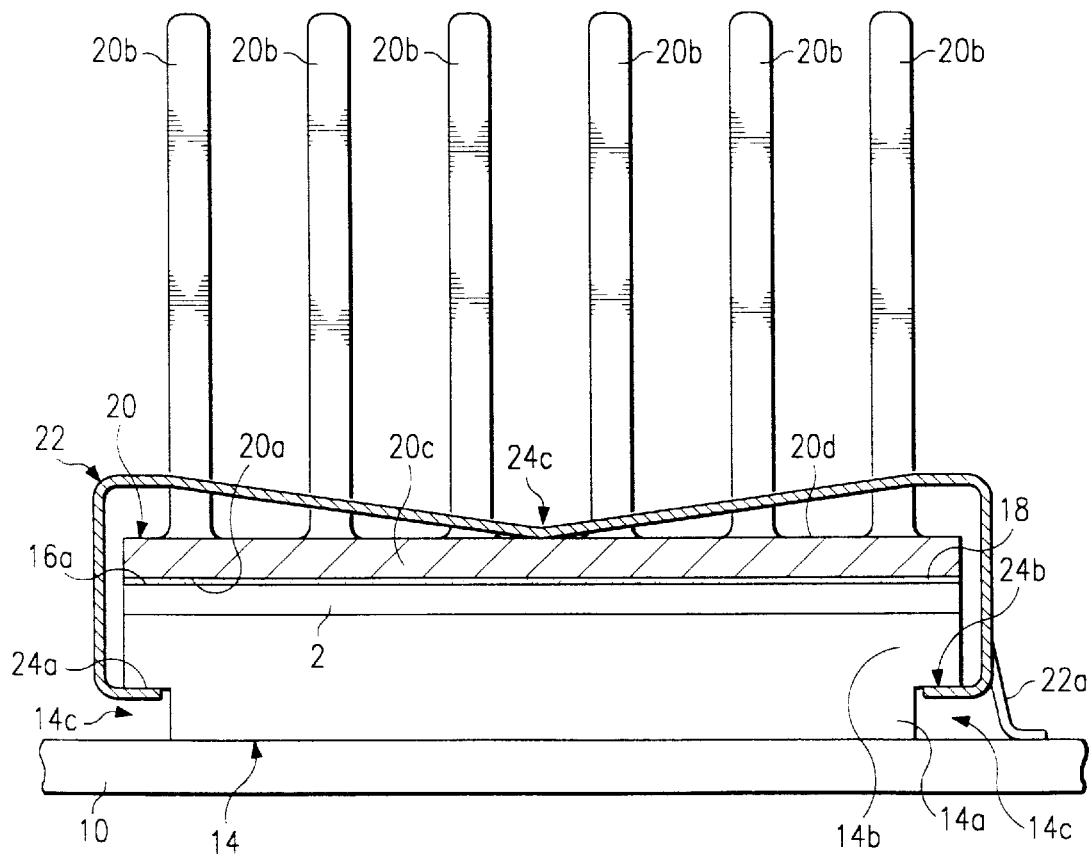
FIG. 2 is a diagram of an electronic circuit of the computer of FIG. 1, having a heat sink clip.

Referring to FIG. 2, the reference numeral 12 generally designates an electronic circuit assembly that is utilized by the personal computer 1. The circuit assembly 12 includes the mother board 10, a chip socket 14, the processor chip 2, a layer of thermal adhesive 18, and a heat sink 20 having a bottom surface 20a and a top surface 20d. Although not shown, the mother board 10 includes electrical traces that electrically interconnect various chips and components, including the chip 2.

The socket 14 is a conventional type socket, such as a pin grid array (PGA) socket. The socket has a lower base portion 14a and an upper portion 14b. Although the socket 14 is composed of a plastic, non-conducting type material, the socket includes electrical conductors (not shown) for electrically connecting the traces on the mother board 10 with the chip 2. In addition, certain portions of the base portion 14a have a smaller cross-sectional area than that of the upper portion 14b, thereby creating recess areas 14c at the base of the socket 14.

The package for the processor chip 2 is a conventional lead package, such as a PGA package. In actuality, the reference numeral 2 is directed toward the PGA package, the processor integrated circuit (not shown) being enclosed therein. The thermal adhesive 18 is applied to a top surface 16a of the chip 2. The thermal adhesive 18 is a conventional epoxy type substance which allows the transfer of heat from the top surface 16a of the chip 2 to the bottom surface 20a of the heat sink 20, but inhibits electrical conduction between the two. However, the thermal adhesive 18 serve as a dielectric between the chip and the heat sink 20 and therefore supports capacitive coupling therebetween.

The heat sink 20 includes a plurality of fins 20b and a base portion 20c. The base portion 20c is made of aluminum that is chromate conversion coated and is electrically conductive. Alternatively, the base portion may have a coating of a material that is not electrically conductive, except for the top surface 20d.

The bottom surface 20a of the heat sink 20 extends over and covers the chip 2, thereby providing the maximum amount of thermal contact area between the two. However, the size of the bottom surface 20a also increases the capacitive coupling between it and the chip 2. The fins 20b extrude upwards and away from the chip 2. In this way, the fins 20b help to remove heat from the chip 2, as well as providing a great deal of surface area from which the heat may dissipate.

The heat sink 20 is mounted to the chip 2 by a clip 22. The clip 22 is made of a flexible metal material, which is also electrically conductive The clip 22 acts as a spring, being compressed at contact points 24a, 24b, 24c. The contact points 24a, 24b are located on the upper portion 14b of the socket 14, inside the recess area 14c. The contact point 24c is located on the top surface 20d of the heat sink base portion 20c. As a result, the heat sink 20 is secured to the chip 2, which is also secured to the socket 14. The clip 22 also includes a tab 22a, which is in frictional contact with the mother board 10. In addition, the connection between the contact point 24c and the clip 22 is of sufficient pressure to support the electrical transfer of high frequency signals into the clip 22.

Figure 3:
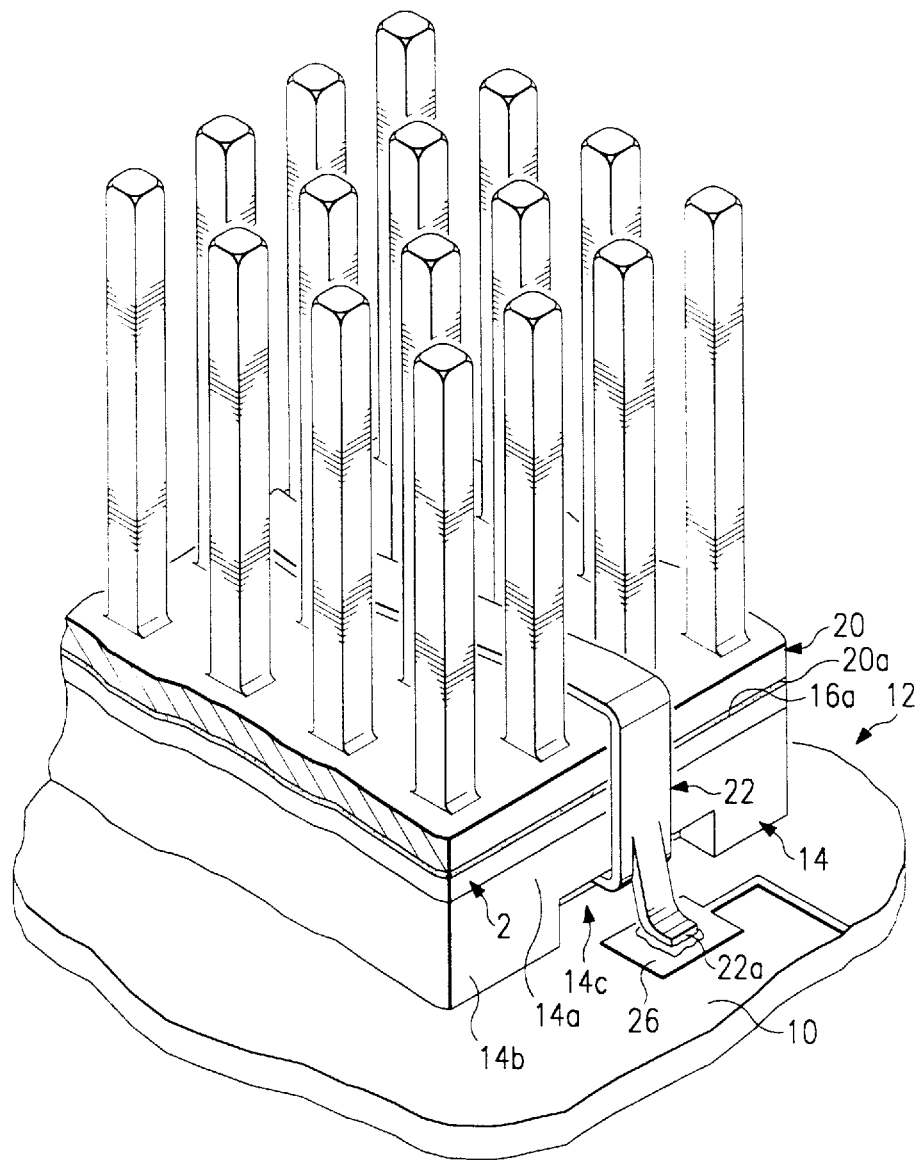
FIG. 3 is an isometric, close-up view of the electronic circuit of FIG. 2.

Referring to FIG. 3, the mother board 10 includes a grounding pad 26, which is electrically connected to a ground power supply (not shown). The pad 26 is position such that the tab 22a comes into frictional contact with the pad whenever the clip 22 is compressed on the heat sink 20 and socket 14. The contact between the tab 22a and the pad 26 is of sufficient pressure to support the electrical transfer of high frequency signals from the clip 22 to the pad. As a result, the clip 22 serves as an electrical conductor of high frequency signals between the heat sink 20 and the pad 26.

During operation, the chip 2 emits EMI radiation. The radiation is transferred to the heat sink 20 through the capacitive coupling therebetween. The radiation then conducts to the clip 22, which routes the radiation into the pad 26. Once the EMI radiation is in the pad 26, it flows to and is absorbed by the ground power supply. As a result, the amplification of EMI radiation by the heat sink 20 is significantly reduced.

Figures 4, 4A:
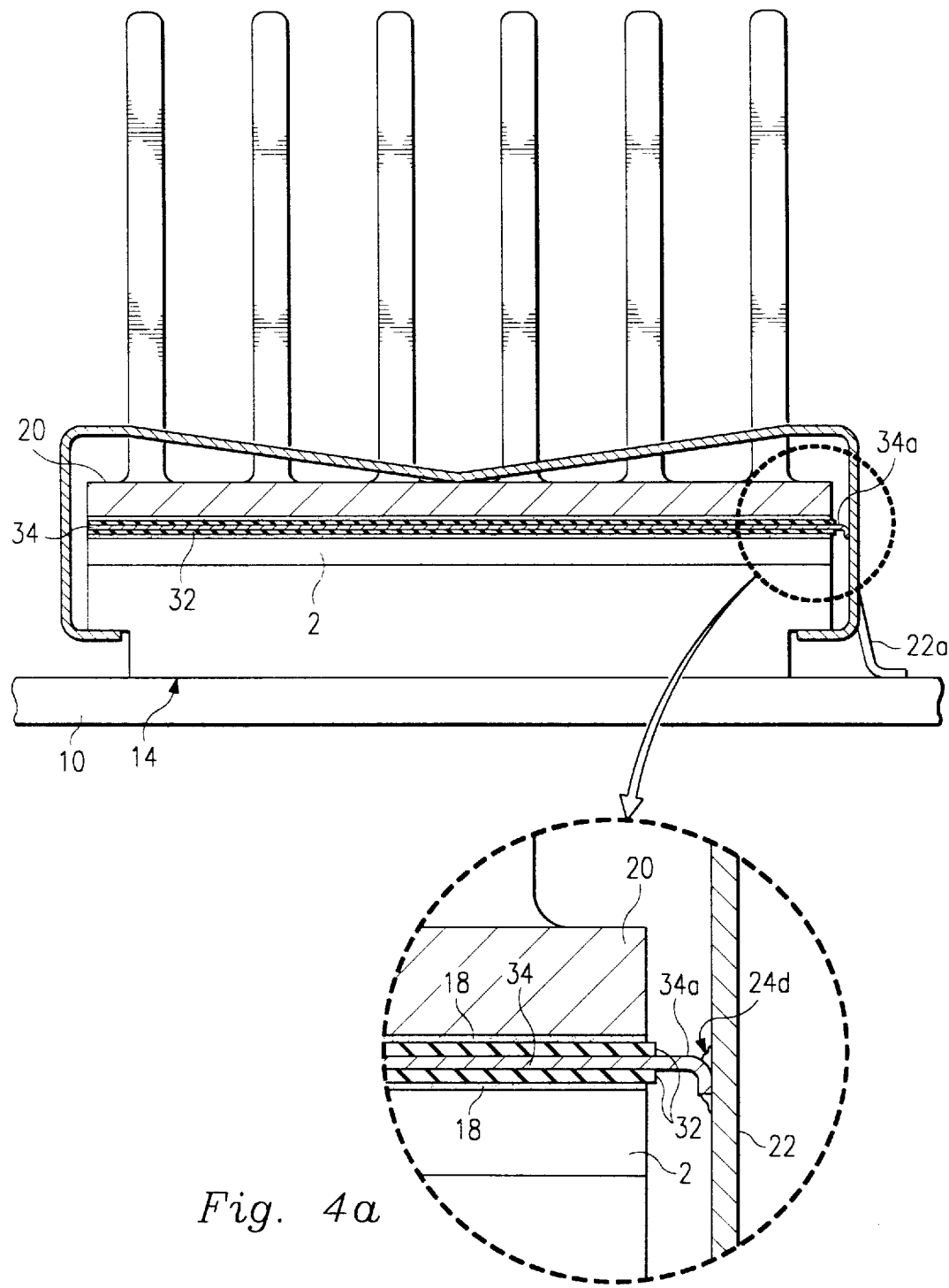
FIGS. 4 and 4a is a diagram of a second electronic circuit, which utilizes a metallic plane and a second embodiment of the heat sink clip.

Referring to FIG. 4, the reference numeral 30 generally designates an alternate embodiment of an electronic circuit assembly that may be utilized by the personal computer 1. The electronic circuit assembly 30 utilizes many of the same components as the electronic circuit 12 of FIG. 2, including the mother board 10, the chip socket 14, the chip 2, the heat sink 20, and the clip 22. Although the heat sink 20 of the first embodiment (FIG. 1) is made electrically conductive by an aluminum chromate process, in the second embodiment, it may instead be covered in a non-conductive, anodized material. Furthermore, in addition of the thermal adhesive 18 of FIG. 1, the heat sink 20 of FIG. 4 is attached to the chip 2 with a metallic plane 34 encapsulated within a thermal pad 32. The metallic plane 34 is made of copper, and therefore is capacitively coupled to the chip 2.

The metallic plane 34 includes a lip portion 34a, which protrudes outwardly from the thermal pad 32 and is in frictional contact with the clip 22 at a point 24d. The frictional contact between the lip portion 34a and the clip 22 is of sufficient pressure to support the electrical transfer of high frequency signals from the metallic plane 34 to the clip 22. As in the FIG. 3 embodiment, the clip 22 is in electrical contact with the pad 26. As a result, the EMI radiation from the chip 2 transfers to the metallic plane 34, to the lip portion 34a, to the clip 22, and into the pad 26. Therefore, a significant amount of the EMI radiation from the chip 2 is transferred to and absorbed by the ground power supply.

It is understood that the present invention can take many forms and embodiments, and that the embodiments shown herein are intended to illustrate rather than limit the invention. Therefore, variations may be made without departing from the spirit of the invention. For example, the heat sink may represent various metallic devices that couple to the chip and therefore amplify the EMI radiation. Furthermore, the clip 22 may be utilized in applications other than computer or electronics applications. Accordingly, it is appropriate that the appended claims be construed broadly and in a manner consistent with the scope of the invention.

What is claimed is:

1. A computer system comprising:
   a motherboard with a pad;
   a socket connected to the motherboard;
   a processor connected to the socket;
   a heat sink thermally connected to the processor;
   a flexible conductive clip for retaining the processor between the heat sink and the socket, the clip including a heat sink contact portion and a pair of legs each engaged with the socket, one of the legs having a tab extending therefrom, the tab being engaged with the pad on the motherboard; and a memory connected to the processor by an interconnecting bus.

2. The computer system of claim 1 wherein the clip is also in electrical contact with the heat sink.

3. The computer system of claim 2 wherein the clip also secures the processor to the socket.

4. The computer system of claim 2 wherein the clip is in electrical contact with the pad and the heat sink through frictional contact.

5. The computer system of claim 1 further comprising a metallic plane between the processor and the heat sink, the metallic plane having a lip portion that is in electrical contact with one leg of the clip.

6. The computer system of claim 5 wherein the clip also secures the processor to the socket.

7. The computer system of claim 5 wherein the heat sink dissipates heat from the processor.

8. A method for attaching a heat sink to an electrical device, the method comprising the steps of:

connecting a socket of the electrical device to a circuit board;

providing a pad on the circuit board proximate to the socket;

placing the heat sink onto a top surface of the electrical device; and physically engaging a clip onto the heat sink and the socket to secure the heat sink to the device, the clip having a pair of legs, each leg engaged with the socket;

wherein the clip includes a tab that extends from one of the legs and engages the pad when the clip is engaged with the heat sink and the socket.

9. The method of claim 8 further comprising the step of:

electrically engaging the clip to the heat sink.

10. The method of claim 9 wherein the clip is in electrical contact with the pad through frictional contact.

11. The method of claim 8 further comprising the step of:

placing a metallic plane between the device and the heat sink, such that the metallic plane is in electrical contact with a leg of the clip.

12. The method of claim 11 wherein the clip is in electrical contact with the metallic plane through frictional contact.

13. A flexible clip apparatus for attaching a metallic device to an electrical device, the electrical device being connected to a circuit board by a socket, the circuit board having a pad proximate thereto, the apparatus comprising:

a main portion for physically engaging with and securing the metallic device to the electrical device;

a pair of legs extending from the main portion and engaging the socket; and a tab portion that extends from one of the legs and engages the pad when the clip is engaged with the metallic device and the socket.

14. The apparatus of claim 13 wherein the main portion also electrically engages with the metallic device.

15. The apparatus of claim 14 wherein the metallic device dissipates heat from the electrical device.

16. The apparatus of claim 14 wherein the tab is in electrical contact with the pad through frictional contact.

17. The apparatus of claim 13 further comprising:

a metallic plane placed between the electrical device and the metallic device such that the metallic plane is in electrical contact with one of the legs.

18. The method of claim 17 wherein the clip is in electrical contact with the metallic plane through frictional contact.

* * * * *